United States Patent
Haas et al.

(10) Patent No.: US 8,938,662 B2
(45) Date of Patent: *Jan. 20, 2015

(54) HAMMING RADIUS SEPARATED DEDUPLICATION LINKS

(75) Inventors: Robert Haas, Aldiswil (CH); Nils Haustein, Soergenioch (DE); Craig Anthony Klein, Tucson, AZ (US); Ulf Troppens, Mainz (DE); Daniel James Winarski, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 316 days.

This patent is subject to a terminal disclaimer.

(21) Appl. No.: 13/453,062

(22) Filed: Apr. 23, 2012

(65) Prior Publication Data

US 2012/0210192 A1  Aug. 16, 2012

Related U.S. Application Data

(63) Continuation of application No. 12/355,442, filed on Jan. 16, 2009, now Pat. No. 8,196,022.

(51) Int. Cl.
*H03M 13/00* (2006.01)
*G06F 17/30* (2006.01)
*H03M 13/09* (2006.01)
*G06F 3/06* (2006.01)

(52) U.S. Cl.
CPC ......... *G06F 17/30286* (2013.01); *H03M 13/09* (2013.01); *G06F 3/0641* (2013.01)
USPC ............................................ 714/777; 714/758

(58) Field of Classification Search
CPC ........................... H03M 13/19; G06F 11/1004
USPC .................................................. 714/777, 758
See application file for complete search history.

(56) References Cited

U.S. PATENT DOCUMENTS

| 2007/0271226 A1* | 11/2007 | Zhang et al. ...................... 707/3 |
| 2009/0271424 A1* | 10/2009 | Bayliss .......................... 707/101 |
| 2010/0037118 A1* | 2/2010 | Saliba et al. .................. 714/752 |
| 2010/0125553 A1* | 5/2010 | Huang et al. .................. 707/661 |
| 2010/0185922 A1 | 7/2010 | Haas et al. |

* cited by examiner

*Primary Examiner* — M. Mujtaba K Chaudry
(74) *Attorney, Agent, or Firm* — Cantor Colburn LLP; Bryan Bortnick

(57) ABSTRACT

A data storage system includes a data storage array configured for de-duplication of duplicate data therein by: identification of a plurality of portions of data; a comparison of each portion of the data to identify duplicate data and identification of a link associated with each duplicate data; a determination of whether a Hamming link-separation-distance of the identified link is greater than twice a Hamming radius of an error correction code in the data storage system; and replacement of the duplicate data with the identified link when it is determined that the Hamming link-separation-distance is greater than twice the Hamming radius.

12 Claims, 4 Drawing Sheets

HAMMING RADIUS SEPARATED DEDUPLICATION LINKS

CROSS-REFERENCE TO RELATED APPLICATION

This application is a continuation of U.S. patent application Ser. No. 12/355,442, filed Jan. 16, 2009, now U.S. Pat. No. 8,196,022, the disclosure of which is incorporated by reference herein in its entirety.

BACKGROUND

The present invention relates to data deduplication, and more specifically, to data deduplication links in separate Hamming circles having a predetermined Hamming link-separation-distance to prevent erroneous data deduplication linking.

Data deduplication typically provides up to a 100:1 reduction of backed-up data by eliminating duplicate copies of data by identifying repetitive storage of identical data. The data deduplication operation identifies the duplicate data, and then replaces the duplicate data by a link which points to the original copy of that duplicate block of data (for block based deduplication) or duplicate file (for file-based deduplication). The data is evaluated by conventional methods to identify duplicate data, such as by hashing or delta differencing. Some conventional hash algorithms used to calculate the Hash code are Message Digit 5 (MD-5), SHA256, etc. Also, the identification of duplicate data may be performed by conducting a cyclical redundancy check (CRC).

There are several problems associated with the conventional methods. One problem is that hash collisions may occur where two different pieces of data have identical hash digests and hence identical links. In this case, conventional methods do not address the possibility of hash digests being different by only 1 or 2 bits, and such "nearly identical" hash digests may present a serious problem when the capability of the error correction code (ECC) can correct more bits than the number of bits by which the hash digests differ. Thus, in the conventional methods, one duplication link may erroneously point to the wrong parent data, thereby causing a subsequent loss of customer data.

There is a desire to provide a method for data deduplication which prevents the problems mentioned-above associated with the conventional methods.

SUMMARY

According to one embodiment, a data storage system includes a data storage array configured for de-duplication of duplicate data therein by: identification of a plurality of portions of data; a comparison of each portion of the data to identify duplicate data and identification of a link associated with each duplicate data; a determination of whether a Hamming link-separation-distance of the identified link is greater than twice a Hamming radius of an error correction code in the data storage system; and replacement of the duplicate data with the identified link when it is determined that the Hamming link-separation-distance is greater than twice the Hamming radius.

In another embodiment, a tangible, computer readable storage medium having computer readable instructions stored thereon that, when executed, implement a method of de-duplicating duplicate data in a data storage system. The method includes identifying a plurality of portions of data; comparing each portion of the data to identify duplicate data and identifying a link associated with each duplicate data; determining whether a Hamming link-separation-distance of the identified link is greater than twice a Hamming radius of an error correction code in the data storage system; and replacing the duplicate data with the identified link when it is determined that the Hamming link-separation-distance is greater than twice the Hamming radius.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
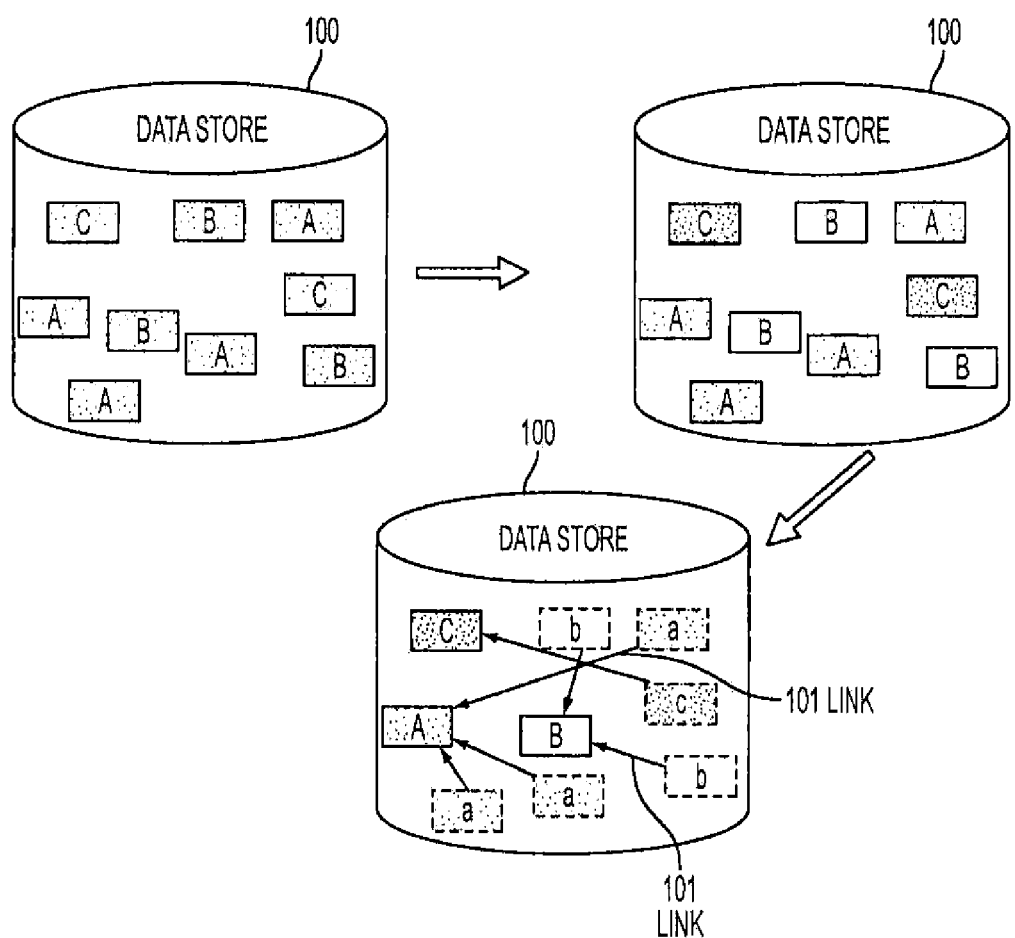
FIG. 1 is a diagram illustrating data storage system that can be implemented within embodiments of the present invention.

FIG. 1 illustrates a data storage system that can be implemented within embodiments of the present invention. As shown FIG. 1, a data storage system 100 is provided. According to an embodiment of the present invention, the data storage system 100 may include a data storage array. The array may be distributed globally, as a GEOPLEX, for example, and the data storage array may be one group of hard disk drives, optical disk drives, holographic disk drives, solid state memory, tape drives, and tape libraries. In the data storage system 100, portions of data (i.e., data objects A, B C) are evaluated via a hashing operation, delta-difference operation, or CRC (Cyclical Redundancy Check) compare, for example, to determine a unique signature. The portions of data may be fixed block size selected from at least one group of 512 bytes, 528 bytes, 1024 bytes, 2048 bytes or 4096 bytes or data files, for example. The signatures values are compared to identify all duplicates (duplicate data). When the duplicate data is identified, the duplicate data objects are replaced with links 101 shown in FIG. 1, linking to a single object (i.e., an original or parent copy). According to an embodiment of the present invention, each link 101 resides within its own Hamming circle as described below with reference to FIG. 2. According to an embodiment of the present invention, the data deduplication may be performed on copies at a block level such as a 512 byte block used in a fixed block architecture (FBA) hard disk drives (HDDs), or at a data-file level (i.e., storing multiple copies of the same file). According to an embodiment of the present invention, a Hamming radius defines a Hamming multi-dimensional circle (or sphere) as shown in FIGS. 2 and 3 to be described below.

According to an embodiment of the present invention, when a hash algorithm is used to identify duplicate data, the hash digest (output of the hash algorithm) is the link associated with the identified duplicate data. According to an embodiment of the present invention, deduplication of data is blocked when a new hash digest has too few differentiating bits versus the existing hash digests. Too few bits are defined by the capability of the ECC. If the number of differentiating bits exceeds the capability of the ECC, then the new hash digest may serve as a valid link for deduplicated data.

Figure 2:
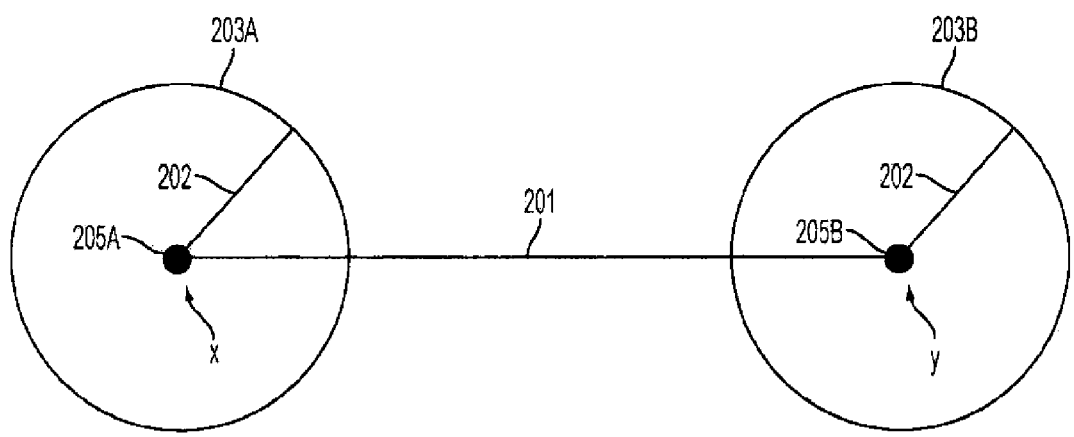
FIG. 2 is a diagram illustrating data deduplication links having a Hamming link-separation-distance that can be implemented within embodiments of the present invention.
Figure 3:
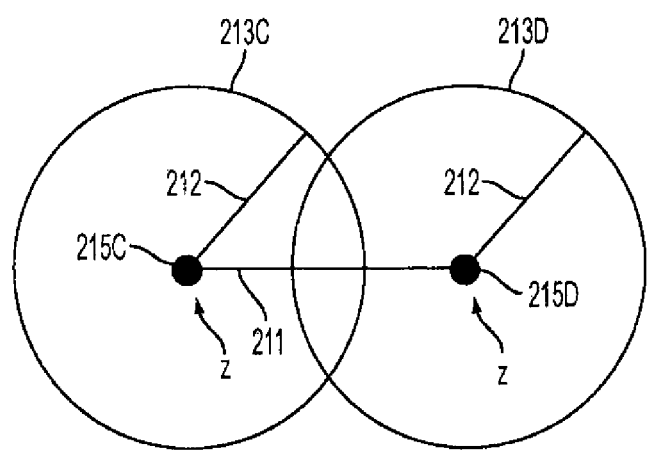
FIG. 3 is a diagram illustrating data deduplication links having a Hamming link-separation-distance according to the conventional art.

FIG. 2 illustrates data deduplication links having a Hamming link-separation-distance that can be implemented within embodiments of the present invention. According to the present invention, as shown in FIG. 2, each deduplication link A and B at centers 205A and 205B respectively, reside in separate, different Hamming circles 203A and 203B to prevent the possibility of having an errant link error-corrected to a different and inappropriate link and hence pointing to the wrong data. According to an embodiment, a Hamming radius 202 refers to a maximum number of bits in each address which can be in error and is correctable by error correction code (ECC). For example, a Hamming radius of 1 means that only one bit can be in error in the deduplication link and is correctable by ECC, and a Hamming radius of 3 means that three bits can be in error in the deduplication link and are correctable by ECC. According to an embodiment of the present invention, as shown further in FIG. 2, the Hamming link-separation-distance 201 separating links A and B at centers 205A and 205B is greater than twice the Hamming radius 202 for Hamming circles 203A and 203B. According to one embodiment, the Hamming link-separation-distance 201 is 16 bits, and the Hamming circles 203A and 203B do not overlap when the Hamming radius 202 is 2 bits. Links X and Y each include an error; however, each link lies in a unique convergence zone (i.e., Hamming circle) and therefore, the ECC corrects each of these links to the desired value at the center of the respective and non-overlapping Hamming circle. The arrows associated with links X and Y denote convergent of the errant links to the desired value at the center of each convergence zone.

A desired deduplication link is as follows: if Link A is "1111111100000000" and Link B is "0000000011111111". As shown in this example, Links A and B are substantially different. According to an embodiment of the present invention, the Hamming link-separation-distance 201 between links A and B is calculated by exclusive-ORing (XOR) the links A and B and adding the resultant digits together to produce 16 ones, "1111111111111111" and by summing the digits in this XOR results shows that these links A and B are spaced apart by a Hamming link-separation-distance 201 of 16. Thus, an ECC of a Hamming radius 202 of 2 or 3 will not falsely error-correct link A to be equal to Link B and vice versa. According to an embodiment of the present invention, the Hamming circles are used to visualize that a link having one or more errant bits cannot be miscorrected to a different link.

A numerical example of the preceding paragraph is instructive. Link X is read as "0011111100000000" and this link X does not matches either Link A at center 205A "1111111100000000" or Link B at center 205B "0000000011111111". An ECC of a Hamming radius 202 of 2 can correct "0011111100000000" to Link A at center 205A "1111111100000000" by changing the leading two zeroes to ones; however, this ECC cannot miscorrect "0011111100000000" to Link B at center 205B "0000000011111111" because that would require changing 14 bits and the ECC can only change 2 bits. Thus, Link A at center 205A "1111111100000000" and Link B at center 205B "0000000011111111" are sufficiently separated by Hamming link-separation-distance 201 that Link X is uniquely corrected to Link A at center 205A and cannot be miscorrected to Link B at center 205B.

FIG. 3 illustrates data deduplication links having a Hamming link-separation-distance according to the conventional art. As shown in FIG. 3, Links C and D are provided at respective centers 215C and 215D and having a Hamming link-separation-distance 211 between them of only 2 bits which may allow the Hamming circles 213C and 213D to overlap if the ECC correction 212 is 2 bits, for example. Link Z is a link having an error and it falls within the convergence zones of both links C and D and thus, link Z may be falsely corrected to the wrong value and therefore point to the wrong parent data. As further shown in FIG. 3, link Z has two directions (as indicated by arrows) which means that it can converge to either the center 215C which represents Link C, or the center 215D which represents Link D.

Further, in another example, when Link C is "1111111100000001" and Link D is "1111111100000010", these links are exclusive-ORed (XOR) resulting in "0000000000000011" and by summing the digits in this XOR result, the links C and D are only separated by a Hamming link-separation-distance of 2. Therefore, an ECC of Hamming radius of 2 may falsely correct errant link Z to link C or link D, thereby potentially causing catastrophic loss of customer data.

Figure 4:
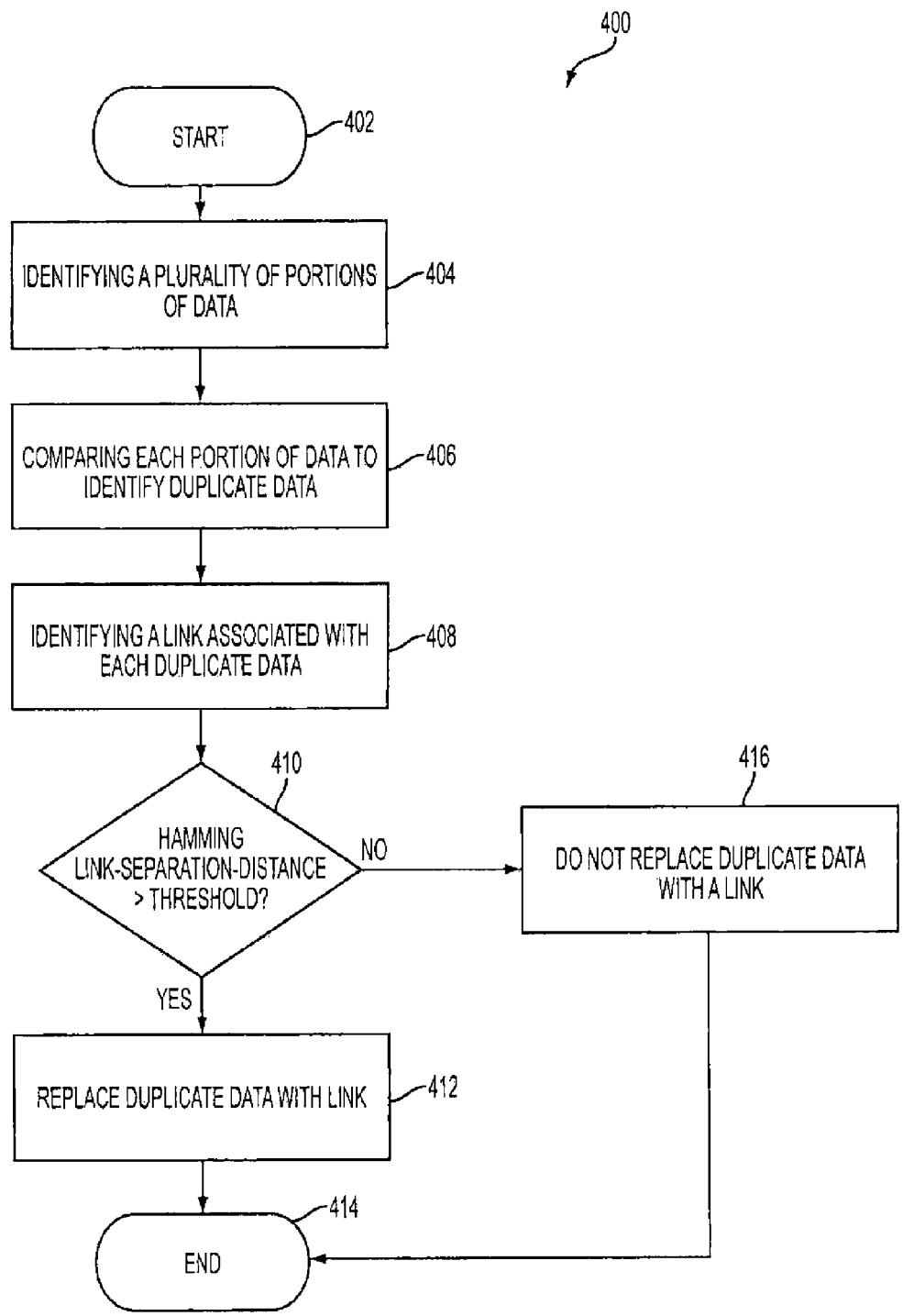
FIG. 4 is a flowchart illustrating a method of deduplicating duplicate data in a data storage system that can be implemented within embodiments of the present invention.

Expanding the numerical example of the preceding paragraph, if Link Z is read as "1111111100000011", then an ECC need change only one of the last two bits to match either Link C at center 215C at "1111111100000001" or Link at center D 215D at "1111111100000010". Thus, a dilemma exists as there are two plausible solutions for correcting errant link Z and only one of these plausible solutions points to the correct data. Link C at center 215C at "1111111100000001" and Link D at center 215D at "1111111100000010" cannot be allowed to co-exist in a deduplication system, because their Hamming link-separation-distance 211 is too small. FIG. 4 described below, addresses this issue by blocking links which are too close together, as measured by the Hamming link-separation-distance.

FIG. 4 illustrates a flowchart of a method 400 of de-duplicating duplicate data according to an embodiment of the present invention. As shown in FIG. 4, the method 400 begins at operation 402. At operation 404, a plurality of portions of data is identified. From operation 404, the process moves to operation 406 where each portion of the data is compared to identify duplicate data. According to an embodiment of the present invention, the comparing of each portion of data includes the performing of a hashing operation, or a delta difference operation, or a CRC compare. From operation 406, the process moves to operation 408 where a link associated with each duplicate data is identified, such as the hash digest from the hashing operation. From operation 408, the process moves to operation 410 where it is determined whether a Hamming link-separation-distance of the identified link is greater than a predetermined threshold, which is a Hamming radius of the ECC correction according to one embodiment of the present invention. When it is determined in operation 410, that the Hamming link-separation-distance of the identified link is greater than twice the Hamming radius of the ECC correction, the process moves to operation 412 where the duplicate data is replaced with the identified link and the process ends at operation 414. On the other hand, when it is determined in operation 410, that the Hamming link-separation-distance of the identified link is less than twice the Hamming radius, the process moves to operation 416 where the duplicate data is not replaced with the identified link and the process ends at operation 414.

According to another embodiment, the Hamming link-separation-distance for the identified link and all existing links is compared to twice the Hamming radius of the ECC correction in operation 410. If it is determined that the Hamming link-separation-distance for identified link and all existing links exceeds the ECC correction, the identified link is a valid link and one which cannot be miscorrected to an existing link. Thus, the link is then accepted and the process flows to operation 412. If it is determined in operation 410, that the Hamming link-separation-distance is less than twice the ECC correction, the newly proposed link identified is invalid as it could be miscorrected to another link, and such an invalid link is rejected and the duplicate data corresponding to this invalid link is not deduplicated as shown in operation 416. According to an embodiment of the present invention, the Hamming link-separation-distance between the links is calculated by exclusive-ORing the two links together and adding the resultant digits together. The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

According to an alternative embodiment of the present invention, at operation 416, a list of spare-links may be provided to replace the link with an insufficient Hamming link-separation-distance, and then operation 412 would be executed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated While the preferred embodiment to the invention had been described, it will be understood that those skilled in the art, both now and in the future, may make various improvements and enhancements which fall within the scope of the claims which follow. These claims should be construed to maintain the proper protection for the invention first described.

The invention claimed is:

1. A data storage system, comprising:
a data storage array configured for de-duplication of duplicate data therein by:
identification of a plurality of portions of data;
a comparison of each portion of the data to identify duplicate data and identification of a link associated with each duplicate data;
a determination of whether a Hamming link-separation-distance of the identified link is greater than twice a Hamming radius of an error correction code in the data storage system; and
replacement of the duplicate data with the identified link when it is determined that the Hamming link-separation-distance is greater than twice the Hamming radius.

2. The data storage system of claim 1, wherein the portions of data are of fixed block sizes.

3. The data storage system of claim 2, wherein the fixed block sizes are from at least one group of 512 bytes, 528 bytes, 1024 bytes, 2048 bytes or 4096 bytes.

4. The data storage system of claim 1, wherein the portions of data are data files.

5. The data storage system of claim 1, wherein the comparison each portion of data comprises performing a hashing operation, or a delta difference operation, or a cyclical redundancy check (CRC) compare.

6. The data storage system of claim 1, wherein the Hamming link-separation-distance between the links is calculated by exclusive ORing the two links together and adding resultant digits together.

7. A tangible, computer readable storage medium having computer readable instructions stored thereon that, when executed, implement a method of de-duplicating duplicate data in a data storage system, the method comprising:
identifying a plurality of portions of data;
comparing each portion of the data to identify duplicate data and identifying a link associated with each duplicate data;
determining whether a Hamming link-separation-distance of the identified link is greater than twice a Hamming radius of an error correction code in the data storage system; and
replacing the duplicate data with the identified link when it is determined that the Hamming link-separation-distance is greater than twice the Hamming radius.

8. The computer readable storage medium of claim 7, wherein the portions of data are of fixed block sizes.

9. The computer readable storage medium of claim 8, wherein the fixed block sizes are from at least one group of 512 bytes, 528 bytes, 1024 bytes, 2048 bytes or 4096 bytes.

10. The computer readable storage medium of claim 7, wherein the portions of data are data files.

11. The computer readable storage medium of claim 7, wherein comparing each portion of data comprises performing a hashing operation, or a delta difference operation, or a cyclical redundancy check (CRC) compare.

12. The computer readable storage medium of claim 7, wherein the Hamming link-separation-distance between the links is calculated by exclusive ORing the two links together and adding resultant digits together.

* * * * *